United States Patent
Seo et al.

(10) Patent No.: US 8,586,401 B2
(45) Date of Patent: Nov. 19, 2013

(54) GAS INJECTION DEVICE AND SOLAR CELL MANUFACTURING METHOD USING THE SAME

(75) Inventors: Seoung-Jin Seo, Suwon-si (KR);
Jung-Gyu Nam, Yongin-si (KR);
Sang-Cheol Park, Yongin-si (KR);
Woo-Su Lee, Yongin-si (KR);
Seong-Ryong Hwang, Yongin-si (KR);
In-Ki Kim, Yongin-si (KR)

(73) Assignees: Samsung SDI Co., Ltd., Yongin-si (KR); Samsung Display Co., Ltd., Yongin-si (KR)

( * ) Notice: Subject to any disclaimer, the term of this patent is extended or adjusted under 35 U.S.C. 154(b) by 32 days.

(21) Appl. No.: 13/271,276

(22) Filed: Oct. 12, 2011

(65) Prior Publication Data
US 2012/0094424 A1    Apr. 19, 2012

(30) Foreign Application Priority Data
Oct. 14, 2010   (KR) .................. 10-2010-0100183

(51) Int. Cl.
*H01L 21/00* (2006.01)
(52) U.S. Cl.
USPC ............... 438/84; 438/102; 257/E21.068

(58) Field of Classification Search
USPC .............. 438/84; 257/E21.069, E21.071, 257/E21.075, E21.16
See application file for complete search history.

(56) References Cited

U.S. PATENT DOCUMENTS

| 2008/0254202 A1 | 10/2008 | Stolt et al. |
| 2009/0095213 A1 | 4/2009 | Birkmire et al. |
| 2009/0130794 A1 | 5/2009 | Probst et al. |
| 2010/0248417 A1* | 9/2010 | Yonezawa et al. .............. 438/84 |

FOREIGN PATENT DOCUMENTS

| JP | 61-138685 A | 6/1986 |
| JP | 01-157519 A | 6/1989 |
| JP | 10-229208 A | 8/1998 |
| JP | 2002-324788 A | 11/2002 |
| JP | 2006-186114 A | 7/2006 |
| JP | 2007-527121 A | 9/2007 |
| JP | 2008-285735 A | 11/2008 |

* cited by examiner

*Primary Examiner* — Cheung Lee
(74) *Attorney, Agent, or Firm* — Christie, Parker & Hale, LLP

(57) ABSTRACT

A solar cell manufacturing method includes forming a first electrode on a substrate, forming a mixed metal layer on the first electrode, forming a light absorbing layer by injecting hydrogen selenide on the entire surface of the mixed metal layer using a gas injection device, and forming a second electrode on the light absorbing layer. Further, the gas injection device includes a gas pipeline, an inner gas pipe positioned in the gas pipeline and having an opening, and a plurality of injection nozzles disposed below the gas pipeline.

12 Claims, 5 Drawing Sheets

GAS INJECTION DEVICE AND SOLAR CELL MANUFACTURING METHOD USING THE SAME

This application claims priority to Korean Patent Application No. 10-2010-0100183 filed on Oct. 14, 2010, and all the benefits accruing therefrom under 35 U.S.C. §119, the entire contents of which are incorporated herein by reference.

BACKGROUND OF THE INVENTION (1) Field of the Invention

The present invention relates to a gas injection device and a solar cell manufacturing method using the same.

(2) Description of the Related Art

Solar cells convert sunlight energy into electrical energy. Solar cells are important clean energy or next-generation energy that replaces fossil energy which causes a greenhouse effect due to discharge of carbon dioxide ($CO_2$) and replaces nuclear energy which contaminates an earth environment such as air pollution due to radioactive waste.

The solar cells basically generate electricity using two kinds of semiconductors such as a P-type semiconductor and an N-type semiconductor. When the solar cells are used as a light absorbing layer, they are classified into various kinds depending on materials used therein.

The solar cell has a general structure in which a front transparent conductive layer, a P-N layer, and a rear reflecting electrode layer are deposited on a substrate in sequence. When sunlight is incident to the solar cell of the structure, electrons are collected on the N layer and holes are collected on the P layer, to thereby generate electric current.

A compound solar cell (copper-indium-gallium-selenide, "CIGS") has high efficiency to convert sunlight into electricity without using silicon unlike known silicon based solar cells. The CIGS may be formed by depositing copper (Cu), indium (In), gallium (Ga) and selenium (Se) compounds on an electrode formed on flexible substrates such as stainless, aluminum, etc., as well as a glass substrate.

In a conventional solar cell, a CIGS (Cu, In, Ga, Se) compound layer may be formed by injecting hydrogen selenide ($H_2Se$) on a mixed layer of copper (Cu), indium (In), and gallium (Ga) after the mixed layer of copper (Cu), indium (In), and gallium (Ga) is formed.

In a conventional method of forming the solar cell, the hydrogen selenide ($H_2Se$) may be injected through a gas pipeline in a gas injection device. As area of the solar cell becomes larger, the injecting area of the hydrogen selenide ($H_2Se$) becomes larger, and the length of the gas pipeline also becomes longer. As the length of the gas pipeline becomes longer, the number of nozzles attached to the gas pipeline is also increased, such that difference of discharge rate of nozzles disposed between an inlet and an outlet of the gas pipeline is generated because pressure is decreased due to channel friction loss in the gas pipeline and discharge rate through the nozzles. Accordingly, since the injecting amount of the hydrogen selenide ($H_2Se$) is not uniform in the conventional method of forming the solar cell, the CIGS (Cu, In, Ga, Se) compound layer is not uniform.

The above information disclosed in this Background section is only for enhancement of understanding of the background of the invention, and therefore contains information that does not form any part of the prior art.

BRIEF SUMMARY OF THE INVENTION

The present invention has been made in an effort to provide a uniform copper-indium-gallium-selenide ("CIGS") compound layer in manufacturing process of a solar cell having a large area.

An exemplary embodiment of the present invention provides a solar cell manufacturing method including forming a first electrode on a substrate, forming a mixed metal layer on the first electrode, forming a light absorbing layer by injecting hydrogen selenide ($H_2Se$) on an entire surface of the mixed metal layer using a gas injection device, and forming a second electrode on the light absorbing layer. The gas injection device includes a gas pipeline, an inner gas pipe positioned in the gas pipeline and a plurality of injection nozzles disposed below the gas pipeline. The inner gas pipe includes an opening extended through a wall of the inner gas pipe, and is disposed between opposing longitudinal ends of the inner gas pipe.

In an embodiment, a cross-section of the inner gas pipe includes a first portion of the wall separated from a second portion of the wall. The opening may be formed in the first portion of the wall opposite to the injection nozzles with respect to the second portion of the wall.

In an embodiment, the opening may have a quadrangle shape, a length of the opening may be about 20% to about 30% of an interval between a first injection nozzle adjacent to an inlet of the gas injection device and a last injection nozzle furthest away from the inlet. A width of the opening may be about 40% to about 45% of a diameter of the inner gas pipe.

In an embodiment, the opening may be positioned apart from the first injection nozzle and in a direction towards the last injection nozzle by about 40% to about 45% of the interval between the first injection nozzle and the last injection nozzle.

In an embodiment, the diameter of the inner gas pipe may be half of a diameter of the gas pipeline.

In an embodiment, both of the longitudinal ends of the inner gas pipe may be opened.

In an embodiment, the longitudinal direction of the inner gas pipe may be parallel to an arrangement direction of the injection nozzles.

In an embodiment, the plurality of injection nozzles may have a same diameter and be disposed at regular intervals in a longitudinal direction of the gas pipeline.

In an embodiment, the mixed metal layer may be made of copper, indium and gallium.

In an embodiment, the forming a light absorbing layer may further include performing a heat treatment using hydrogen selenide ($H_2Se$) at about 500 degrees Celsius (° C.) to about 600° C.

In an embodiment, the first electrode may be made of reflective conductive metal and the second electrode may be made of transparent conductive metal.

In an embodiment, the method may further include forming a buffer layer between the light absorbing layer and the second electrode.

An exemplary embodiment of the present invention provides a gas injection device including a gas pipeline, an inner gas pipe within the gas pipeline, and including an opening extended through a wall of the inner gas pipe and disposed between opposing longitudinal ends of the inner gas pipe, and a plurality of injection nozzles disposed below the gas pipeline.

According to exemplary embodiments of the present invention, a CIGS compound layer is uniformly formed in a solar cell having a large area, by uniformly injecting hydrogen selenide ($H_2Se$), using a gas injection device including an inner gas pipe having an opening which is formed in a gas pipeline within the gas pipe.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION OF THE INVENTION

Figure 1:
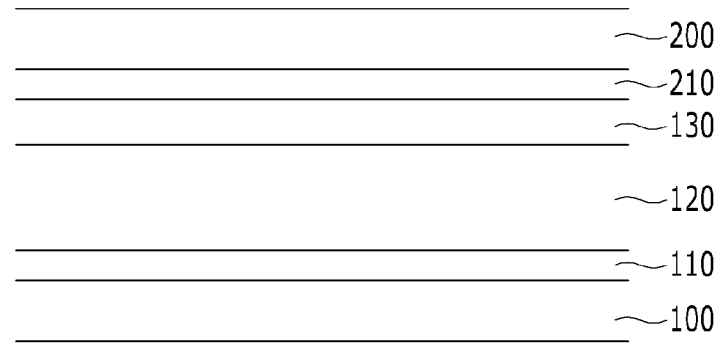
FIG. 1 is a cross sectional view of an exemplary embodiment of a solar cell, according to the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. On the contrary, the embodiments introduced herein are provided to fully understand the disclosed contents and fully transfer the spirit of the present invention to those skilled in the art.

In the drawings, the thickness of layers, films, panels, regions, etc., are exaggerated for clarity. When a layer is referred to as being "on" another layer or a substrate, it can be directly on another layer or the substrate, or an intervening layer may also be present. In contrast, when an element is referred to as being "directly on" another element or layer, there are no intervening elements or layers present. Throughout the specification, like reference numerals refer to like elements. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 is a cross sectional view of an exemplary embodiment of a solar cell, according to the present invention.

Referring to FIG. 1, the solar cell of the exemplary embodiment of the present invention includes a first electrode 110 directly on a first substrate 100. The first electrode 110 includes a reflective conductive metal such as molybdenum (Mo), aluminum (Al), or copper (Cu).

A light absorbing layer 120 and a buffer layer 130 are directly on the first electrode 110 in sequence. The light absorbing layer 120 includes a copper-indium-gallium-selenide ("CIGS"), for example $CuInGaSe_2$, compound and functions as a P-type semiconductor actually absorbing light.

The buffer layer 130 is between P-N junctions to reduce a difference in lattice constant and an energy band gap between a P-type semiconductor and an N-type semiconductor. Accordingly, an energy band value of a material used as the buffer layer 130 may be a middle value of the energy band gap between the P-type semiconductor and the N-type semiconductor. The buffer layer 130 includes CdS, Zn(O,S,OH), In(OH)xSy, ZnInxSey, ZnSe, and the like.

A second electrode 210 is directly on the buffer layer 130. The second electrode 210 includes a transparent conductive material as an N-type semiconductor. The second electrode 210 includes ZnO:Al. An upper surface of the second electrode 210 is textured (e.g., non-linear) in order to increase an effective light quantity absorbed in the solar cell, by reducing light reflection on the surface of the solar cell.

A second substrate 200 is directly on the upper surface of the second electrode 210.

Hereinafter, referring to FIGS. 2 to 4, an exemplary embodiment of a method of manufacturing the solar cell shown in FIG. 1 will be described.

Figure 2:
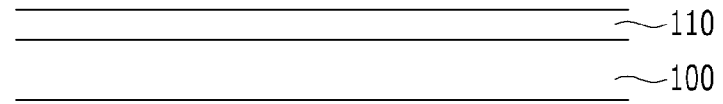
FIGS. 2 to 4 are diagrams showing an exemplary embodiment of a method of manufacturing the solar cell of FIG. 1.
Figure 3:
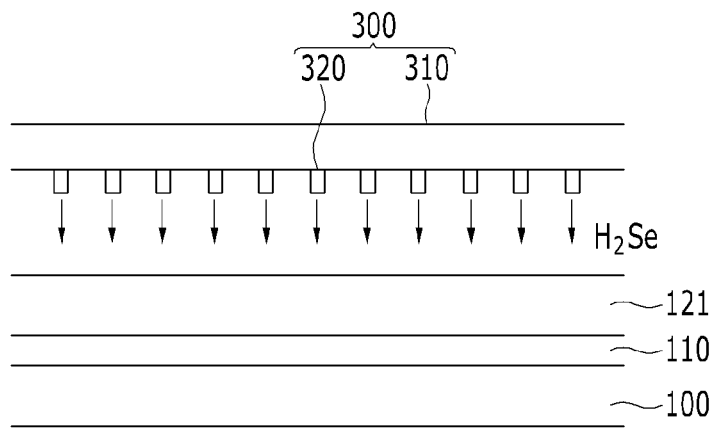
Figure 4:
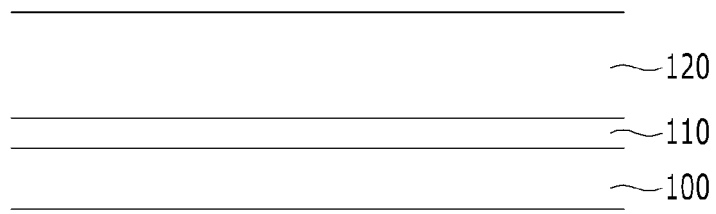

FIGS. 2 to 4 are cross-sectional views sequentially illustrating the exemplary embodiment of a method of manufacturing the solar cell of FIG. 1.

As shown in FIGS. 2 to 4, the first electrode 110 is formed by depositing a reflective conductive metal such as molybdenum, aluminum or copper directly on the first substrate 100. A mixed metal layer 121 formed by mixing copper (Cu), indium (In), and gallium (Ga) is subsequently formed directly on the formed first electrode 110.

Thereafter, a high-temperature heat treatment is performed by applying hydrogen selenide (H2Se) directly on an entire upper surface of the mixed metal layer 121, at about 500 degrees Celsius (° C.) to about 600° C. The entire of the upper surface is considered as a "large" area in the solar cell of FIG. 1. In the illustrated embodiment, the hydrogen selenide (H2Se) is injected on the entire surface of the mixed metal layer 121 using a gas injection device 300.

The gas injection device 300 includes a gas pipeline 310 and a plurality of an injection nozzle 320 disposed below the gas pipeline 310, between the gas pipeline 310 and the mixed metal layer 121. The plurality of injection nozzles 320 are disposed at regular intervals and have substantially a same diameter.

The hydrogen selenide (H2Se) which initially flows into the gas pipeline 310 is injected on the entire surface of the mixed metal layer 121 through the plurality of injection nozzles 320, and is injected from the plurality of injection nozzles 320 with a nearly constant amount from each of the nozzles 320.

When the high-temperature heat treatment is performed by the hydrogen selenide ($H_2Se$), the light absorbing layer 120 is formed by mixing selenium in the mixed metal layer 121, as shown in FIG. 4. The light absorbing layer 120 includes the CIGS compound and functions as a P-type semiconductor actually absorbing light.

As shown in FIG. 1, the buffer layer 130 is formed by depositing any one of CdS, Zn(O,S,OH), In(OH)xSy, ZnInx-Sey, and ZnSe directly on the formed light absorbing layer 120. The second electrode 210 is formed directly on formed the buffer layer 130. The second electrode 210 as the N-type semiconductor is made of a transparent conductive material, e.g., ZnO:Al. In the forming of the second electrode 210 including the transparent conductive material, texturing for forming an unevenness may be performed by etching an upper surface of the second electrode 210. The texturing of the upper surface of the second electrode 210 is performed in order to increase an effective light quantity absorbed in the solar cell by reducing light reflection on the surface of the solar cell.

Thereafter, the second substrate 200 is formed directly on the second electrode 210 to complete the solar cell of FIG. 1.

As described above, the CIGS compound layer (e.g., the light absorbing 120) is uniformly formed in the solar cell having a large area by uniformly injecting the hydrogen selenide ($H_2Se$) from the plurality of injection nozzles 320 disposed at regular intervals and having substantially the same diameter, and by performing the high-temperature heat treatment on the entire surface of the mixed metal layer 121 after the mixed metal layer 121 of copper, gallium, and indium is formed.

A solar cell including the light absorbing layer 120 is formed by injecting hydrogen selenide ($H_2Se$) from the gas injection device 300 in a manufacturing process of the solar cell. The light absorbing layer 120 of a final solar cell having a uniform material application and uniform structure (e.g., dimensional thickness, etc.) is considered a structural characteristic of the final solar cell. Since the uniform light absorbing layer 120 is imparted by injecting the hydrogen selenide ($H_2Se$) using a plurality of injection nozzles 320 disposed at regular intervals and having substantially the same diameter, and is imparted by injecting the hydrogen selenide ($H_2Se$) over an entire surface of the base mixed metal layer 121 of the light absorbing layer 120, such process using the plurality of injection nozzles 320 disposed at regular intervals and having substantially the same diameter, and such process injecting the hydrogen selenide ($H_2Se$) over an entire surface of the base mixed metal layer 121, is considered to impart the distinct structural characteristic of the uniform light absorbing layer 120.

Hereinafter, referring to FIGS. 5 to 8, an exemplary embodiment of a gas injection device, according to the present invention, will be described.

Figure 5:
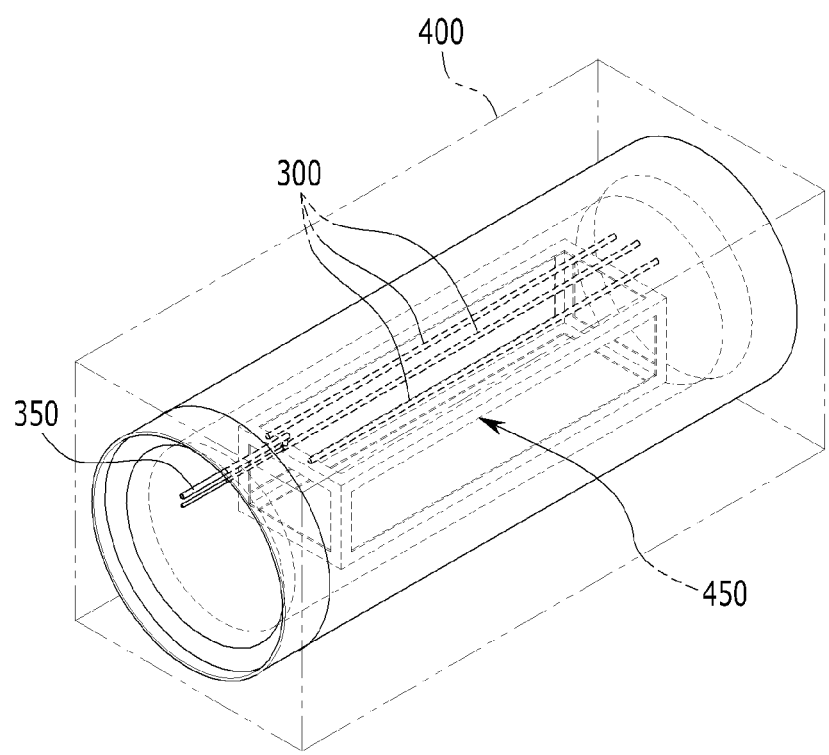
FIG. 5 is a perspective view schematically showing an exemplary embodiment of an electric furnace, according to the present invention.

FIG. 5 is a perspective view schematically showing an exemplary embodiment of an electric furnace, according to the present invention.

As shown in FIG. 5, a plurality of gas injection devices 300 are positioned in an electric furnace 400 and connected to a gas inlet 350. Hydrogen selenide ($H_2Se$) is supplied to the gas inlet 350. A support 450 on which a target is injected with the hydrogen selenide ($H_2Se$) from the gas injection devices 300, is below the gas injection device 300.

Figure 6:
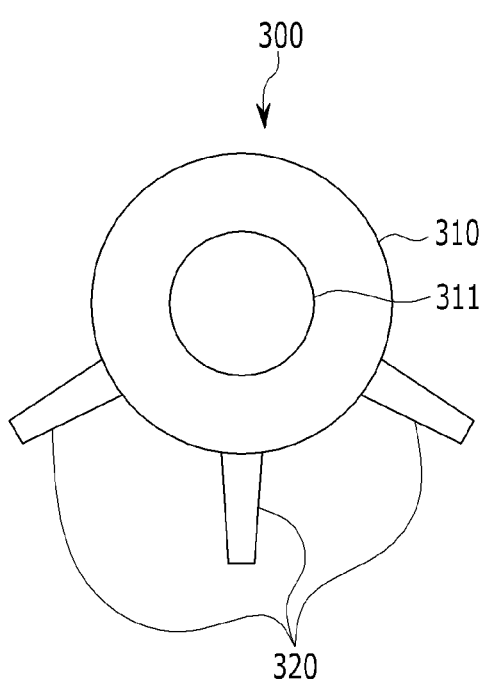
FIG. 6 is a front cross-sectional view of an exemplary embodiment of a gas injection device, according to the present invention.
Figure 7:
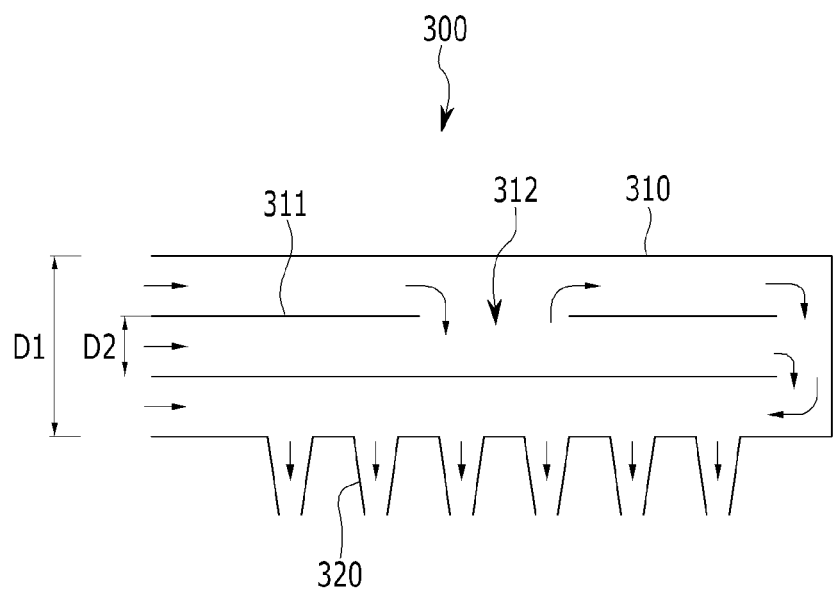
FIG. 7 is a side cross-sectional view of the exemplary embodiment of a gas injection device, according to the present invention.
Figure 8:
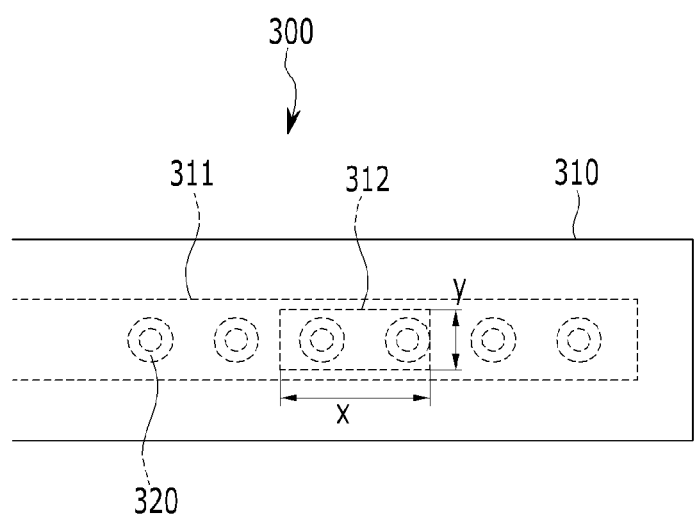
FIG. 8 is a plan view of the exemplary embodiment of a gas injection device, according to the present invention.

FIG. 6 is a front cross-sectional view of an exemplary embodiment of a gas injection device according to the present invention, FIG. 7 is a side cross-sectional view of the exemplary embodiment of a gas injection device according to the present invention, and FIG. 8 is a plan view of the exemplary embodiment of a gas injection device according to the present invention.

As shown in FIGS. 6 to 8, the gas injection device 300 of the illustrated exemplary embodiment includes a gas pipeline 310 and a plurality of injection nozzles 320.

The plurality of injection nozzles 320 are disposed below the gas pipeline 310. The plurality of injection nozzles 320 are attached at a predetermined location of the gas pipeline 310 and longitudinally extended from the gas pipeline 310 in three different directions. An inner gas pipe 311 having an opening 312 is positioned in the gas pipeline 310. A first injection nozzle is adjacent to an inlet of the gas injection device, and a last injection nozzle is furthest away from the inlet.

The plurality of injection nozzles 320 are disposed at regular intervals and have a same diameter. The regular intervals may be along a longitudinal direction of the gas pipeline 310 and/or along a circumference of the gas pipeline 310. The diameter may be taken as an inner or outer diameter at a distal end of an injection nozzle 320, or may be taken at a same point along the longitudinal direction of the extended nozzle 320. An end of the inner gas pipe 311 within the gas pipeline 310 is not closed, as illustrated at the right side of FIG. 7. The inner gas pipe 311 is extended in a longitudinal direction which is parallel to an arrangement direction of the injection nozzles 320 along the gas pipeline 310, for example, a horizontal direction of FIG. 7.

The inner gas pipe 311 includes walls open at an end of the inner gas pipe 311, and may include an upper wall and a lower wall with a channel defined therebetween, in the cross-sectional view of FIG. 7. The lower wall is between the channel and the plurality of injection nozzles 320.

The opening 312 of the inner gas pipe 311 is formed in the upper wall, which is opposite to the injection nozzles 320 with respect to the channel. The opening 312 is extended completely through a thickness of the wall of the inner gas pipe 311, such that the wall of the inner gas pipe solely defines the opening 312.

A diameter D2 of the inner gas pipe 311 is a about half of a diameter D1 of the gas pipeline 310. The walls of the inner gas pipe 311 are completely within walls and spaced apart from walls of the gas pipeline 310, as illustrated in FIGS. 6-8.

The opening 312 has a quadrangle shape in a plan view of the inner gas pipe 311, as illustrated in FIG. 8. A length (X) of the opening 312 in a longitudinal direction of the inner gas pipe 311 is about 20% to about 30% of an interval between a first injection nozzle adjacent to the gas inlet 350, and a last injection nozzle furthest from the gas inlet 350. A width (Y) of the opening 312 in a direction perpendicular to the longitudinal direction of the inner gas pipe 311 is about 40% to about 45% of the diameter D2 of the inner gas pipe 311. In the illustrated exemplary embodiment of the present invention, the opening 312 is the quadrangle shape, but the planar shape of the opening 312 is not limited thereto and may have various shapes.

The opening 312 is positioned apart from the first injection nozzle and in a direction towards the last injection nozzle, by about 40% to about 45% of the interval between the first injection nozzle and the last injection nozzle.

The hydrogen selenide ($H_2Se$) which flows into the gas pipeline 310 moves to within walls of the inner gas pipe 311, and moves to outside of the wall of the inner gas pipe 311 (indicated by the various arrows in FIG. 7), and is mixed in the end of the inner gas pipe 311 and finally injected through the injection nozzles 320. The opening 312 formed in the inner gas pipe 311 reduces a pressure difference between both ends of the gas pipeline 310.

That is, since the inner gas pipe 311 is disposed in the gas pipeline 310 and includes the opening 312 is disposed in the inner gas pipe 311, a part of a total pressure within the gas pipeline 310 is compensated, thereby reducing the pressure difference between both of opposing ends of the gas pipeline 310. Therefore, the hydrogen selenide (H2Se) is injected through the plurality of injection nozzles 320 in a substantially same amount from each of the nozzles 320.

A solar cell including the light absorbing layer 120 is formed by injecting hydrogen selenide ($H_2Se$) from the gas injection device 300 in a manufacturing process of the solar cell. The light absorbing layer 120 of a final solar cell having a uniform material application and uniform structure (e.g., dimensional thickness, etc.) is considered a structural characteristic of the final solar cell. Since the uniform light absorbing layer 120 is imparted by injecting the hydrogen selenide ($H_2Se$) using the inner gas pipe 311 disposed in the gas pipeline 310 and including the opening 312 disposed in the inner gas pipe 311, to reduce the pressure difference between both of opposing ends of the gas pipeline 310 and to inject a substantially same amount of hydrogen selenide ($H_2Se$) from each of the nozzles 320, such process using the inner gas pipe 311 disposed in the gas pipeline 310 and including the opening 312 is considered to impart the distinct structural characteristic of the uniform light absorbing layer 120.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A solar cell manufacturing method, comprising:
   forming a first electrode on a substrate;
   forming a mixed metal layer on the first electrode;
   forming a light absorbing layer by injecting hydrogen selenide on an entire surface of the mixed metal layer, using a gas injection device; and
   forming a second electrode on the light absorbing layer,
   wherein the gas injection device comprises:
   a gas pipeline,
   an inner gas pipe within and spaced from the gas pipeline, and including an opening extended through a wall of the inner gas pipe and disposed between opposing longitudinal ends of the inner gas pipe, and
   a plurality of injection nozzles between the gas pipeline and the mixed metal layer.

2. The method of claim 1, wherein:
   a cross-section of the inner gas pipe includes a first portion of the wall separated from a second portion of the wall, and
   the opening of the inner gas pipe is formed in the first portion of the wall opposite to the injection nozzles with respect to the second portion of the wall.

3. The method of claim 2, wherein:
   the opening has a planar quadrangle shape,
   a length of the opening in a longitudinal direction of the inner gas pipe is about 20% to about 30% of an interval between a first injection nozzle adjacent to an inlet of the gas injection device, and a last injection nozzle furthest away from the inlet, and
   a width of the opening taken perpendicular to the longitudinal direction of the inner gas pipe is about 40% to about 45% of a diameter of the inner gas pipe.

4. The method of claim 3, wherein:
   the opening is positioned apart from the first injection nozzle and in a direction towards the last injection nozzle by about 40% to about 45% of the interval between the first injection nozzle and the last injection nozzle.

5. The method of claim 4, wherein:
   the diameter of the inner gas pipe is half of a diameter of the gas pipeline.

6. The method of claim 5, wherein:
   both of the longitudinal ends of the inner gas pipe are opened.

7. The method of claim 6, wherein:
   the longitudinal direction of the inner gas pipe is parallel to an arrangement direction of the injection nozzles.

8. The method of claim 1, wherein:
   the plurality of injection nozzles have a same diameter and are disposed at regular intervals.

9. The method of claim 1, wherein:
   the mixed metal layer is made of copper, indium, and gallium.

10. The method of claim 9, wherein:
    the forming a light absorbing layer further includes performing a heat treatment using hydrogen selenide at about 500 degrees Celsius to about 600 degrees Celsius.

11. The method of claim 1, wherein:
    the first electrode is made of reflective conductive metal, and
    the second electrode is made of transparent conductive metal.

12. The method of claim 1, further comprising:
    forming a buffer layer between the light absorbing layer and the second electrode.

\* \* \* \* \*